United States Patent
Cho et al.

(10) Patent No.: US 9,759,968 B2
(45) Date of Patent: Sep. 12, 2017

(54) THIN FILM TRANSISTOR SUBSTRATE, LIQUID CRYSTAL DISPLAY DEVICE HAVING THE SAME AND METHOD OF MANUFACTURING THE SAME

(71) Applicant: Samsung Display Co., Ltd., Yongin, Gyeonggi-do (KR)

(72) Inventors: Ki-Hyun Cho, Suwon-si (KR); Sung-Kyun Park, Suwon-si (KR); Ji-Hyun Kim, Suwon-si (KR); Jeong-Min Park, Seoul (KR); Jung-Soo Lee, Seoul (KR); Jun Chun, Yongin-si (KR); Jin-Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 187 days.

(21) Appl. No.: 14/576,123

(22) Filed: Dec. 18, 2014

(65) Prior Publication Data

US 2015/0228732 A1   Aug. 13, 2015

(30) Foreign Application Priority Data

Feb. 12, 2014   (KR) ........................ 10-2014-0015889

(51) Int. Cl.
  *G02F 1/1362* (2006.01)
  *H01L 29/786* (2006.01)
  *H01L 29/66* (2006.01)

(52) U.S. Cl.
  CPC .. *G02F 1/136227* (2013.01); *H01L 29/66969* (2013.01); *H01L 29/7869* (2013.01); *H01L 29/78606* (2013.01); *G02F 2001/136231* (2013.01); *G02F 2001/136236* (2013.01)

(58) Field of Classification Search
  CPC ............ H01L 29/408; H01L 29/41733; H01L 29/66969; H01L 29/7869
  See application file for complete search history.

(56) References Cited

U.S. PATENT DOCUMENTS

| | | | |
|---|---|---|---|
| 2012/0068944 A1 | 3/2012 | Oh et al. | |
| 2013/0077034 A1 | 3/2013 | Jung et al. | |
| 2015/0241724 A1* | 8/2015 | Okabe ................. | G02F 1/13454 349/47 |

FOREIGN PATENT DOCUMENTS

| | | | | |
|---|---|---|---|---|
| JP | WO 2014046031 A1 * | 3/2014 | ......... | G02F 1/13454 |
| KR | 10-2006-0000363 A | 1/2006 | | |
| KR | 10-2012-0030704 A | 3/2012 | | |
| KR | 10-2013-0011794 A | 1/2013 | | |

* cited by examiner

*Primary Examiner* — Errol Fernandes
(74) *Attorney, Agent, or Firm* — Lewis Roca Rothgerber Christie LLP (57) ABSTRACT

A thin film transistor substrate includes a gate electrode on a base substrate, an active pattern on the gate electrode, a source electrode on a first end of the active pattern, a drain electrode on a second end of the active pattern, an organic insulation layer on the source electrode and the drain electrode, and a transparent electrode contacting the drain electrode through a contact opening in the organic insulation layer. The drain electrode is spaced from the source electrode. The organic insulation layer includes a first thickness portion around the contact opening and a second thickness portion adjacent to the first thickness portion. The second thickness portion has a thickness greater than that of the first thickness portion.

18 Claims, 6 Drawing Sheets

THIN FILM TRANSISTOR SUBSTRATE, LIQUID CRYSTAL DISPLAY DEVICE HAVING THE SAME AND METHOD OF MANUFACTURING THE SAME

CROSS-REFERENCE TO RELATED APPLICATION

This application claims priority to and the benefit of Korean Patent Application No. 10-2014-0015889, filed on Feb. 12, 2014 in the Korean Intellectual Property Office, the content of which is incorporated by reference in its entirety.

BACKGROUND

1. Field

Example embodiments of the present invention relate to a thin film transistor substrate, a liquid crystal display device having the thin film transistor substrate, and a method of manufacturing the thin film transistor substrate.

2. Description of the Related Art

A display panel, such as a liquid crystal display panel, an organic light emitting display panel, etc., may include an array substrate and an opposing substrate facing the array substrate. For example, the liquid crystal display panel may further include a liquid crystal layer between the array substrate and the opposing substrate. The array substrate may include a plurality of pixel electrodes. The array substrate may further include a plurality of signal lines and a plurality of switching elements to provide the pixel electrodes with electrical signals.

Research and development are being conducted to increase pixel resolution of the display panel in order to improve display quality. For example, a recently developed display panel may include more than 500 pixels in a square inch and may be configured to display an image having a pixel resolution of 4096×3072.

As the number of pixel electrodes in a unit area increases to display a high definition image, technologies have also been developed to reduce sizes of the signal lines.

SUMMARY

An aspect of an example embodiment of the present invention is directed toward a thin film transistor substrate capable of decreasing a size of a contact opening (e.g., a contact hole) electrically coupling a transparent electrode with a switching element.

Also, an aspect of an example embodiment of the present invention is directed toward a liquid crystal display panel having the thin film transistor substrate.

Furthermore, an aspect of an example embodiment of the present invention is directed toward a method of manufacturing the thin film transistor substrate.

Even further, aspects of example embodiments of the present invention are directed toward a thin film transistor substrate, a liquid crystal display device having the thin film transistor substrate, and a method of manufacturing the thin film transistor substrate capable of displaying high resolution image.

In an example embodiment of a thin film transistor substrate according to the present invention, the thin film transistor substrate includes a gate electrode on a base substrate, an active pattern on (e.g., overlapping) the gate electrode, a source electrode on a first end portion of the active pattern, a drain electrode on a second end (e.g., a second end portion) of the active pattern, an organic insulation layer on the source electrode and the drain electrode, and a transparent electrode contacting the drain electrode via (e.g., through) a contact opening (e.g., a contact hole) in the organic insulation layer. The drain electrode is spaced from the source electrode. The organic insulation layer include a first thickness portion around the contact opening and a second thickness portion adjacent to the first thickness portion. The second thickness portion has a thickness greater than that of the first thickness portion.

In an example embodiment, the first thickness portion may be over (e.g., may partially overlap) the drain electrode.

In an example embodiment, the thickness of the first thickness portion may be equal to or less than about 2.0 μm.

In an example embodiment, the thickness of the second thickness portion may be equal to or greater than about 2.0 μm.

In an example embodiment, the thickness of the second thickness portion may be greater than the thickness of the first thickness portion by about 0.5 μm or more.

In an example embodiment, a width of the contact opening may be equal to or greater than about 1.0 μm and equal to or less than about 2.0 μm.

In an example embodiment, the thin film transistor substrate may further include an inorganic insulation layer between the drain electrode and the organic insulation layer.

In an example embodiment, the transparent electrode may be over the first thickness portion of the organic insulation layer.

In an example embodiment, a first height of the first thickness portion of the organic insulation layer may be less than a second height of the second thickness portion of the organic insulation layer with respect to the base substrate.

In an example embodiment, the second thickness portion of the organic insulation layer may surround (e.g., may surround a periphery of) the first thickness portion of the organic insulation layer.

In an example embodiment of a liquid crystal display panel according to the present invention, the liquid crystal display panel includes an array substrate including a thin film transistor, an opposing substrate facing the array substrate, and a liquid crystal layer between the array substrate and the opposing substrate. The array substrate further includes a gate line on a base substrate extending in a first direction, a data line extending in a second direction which crosses the first direction, an organic insulation layer on the thin film transistor, and a pixel electrode contacting a drain electrode of the thin film transistor at a contact opening in the organic insulation layer. The gate line is electrically coupled to the thin film transistor. The data line is electrically coupled to the thin film transistor. The organic insulation layer includes a first thickness portion around the contact opening and a second thickness portion adjacent to the first thickness portion. The second thickness portion has a thickness greater than that of the first thickness portion.

In an example embodiment, the first thickness portion may be over the drain electrode.

In an example embodiment, the thickness of the first thickness portion may be equal to or less than about 2.0 μm.

In an example embodiment, the second thickness portion may be greater than the first thickness portion by about 0.5 μm or more.

In an example embodiment, a width of the contact opening may be equal to or greater than about 1.0 μm and equal to or less than about 2.0 μm.

In an example embodiment, the second thickness portion of the organic insulation layer may surround (e.g., may surround a periphery of) the first thickness portion of the organic insulation layer.

In an example embodiment of a method of manufacturing a thin film transistor substrate according to the present invention, a gate electrode is formed on a base substrate. A gate insulation layer is formed over (e.g., formed to cover) the gate electrode. An active pattern is formed on the gate insulation layer. The active pattern is over (e.g., overlaps) the gate electrode. A source electrode and a drain electrode are formed to respectively be over (e.g., to overlap) a first end (e.g., a first end portion) and a second end (e.g., a second end portion) of the active pattern. A passivation layer is formed over (e.g., to cover) the source electrode and the drain electrode. An organic insulation layer is formed over (e.g., to cover) the passivation layer. The organic insulation layer is patterned by using (utilizing) a mask having a light transmitting portion, a half-transmitting portion, and a light blocking portion so that a first thickness portion of the organic insulation layer is formed. The light transmitting portion of the mask is over (e.g., overlaps) a portion of the drain electrode. The half-transmitting portion of the mask is over (e.g., overlaps) the first thickness portion of the organic insulation layer.

In an example embodiment, a photoresist pattern may be further formed on the organic insulation layer which has the first thickness portion. A portion of the passivation layer which is not covered by the photoresist pattern may be removed to expose the portion of the drain electrode. The photoresist pattern may be removed. A transparent electrode may be formed on the organic insulation layer. The transparent electrode may contact the portion of the drain electrode.

In an example embodiment, a width of the portion of the drain electrode may be equal to or greater than about 1.0 μm and equal to or less than about 2.0 μm.

In an example embodiment, a thickness of the first thickness portion of the organic insulation layer may be equal to or less than about 2.0 μm.

According to one or more example embodiments of the thin film transistor substrate, a liquid crystal display panel having the thin film transistor substrate, and a method of manufacturing the thin film transistor substrate, an organic insulation layer may have a relatively small thickness around a contact opening so that a height of a photoresist pattern on the organic insulation layer around the contact opening may be reduced, thereby forming the contact opening to have a relatively small size by using the photoresist pattern.

BRIEF DESCRIPTION OF THE DRAWINGS

The above and other features and aspects of the present invention will become more apparent by describing, in detail, example embodiments thereof with reference to the accompanying drawings, in which.

DETAILED DESCRIPTION

Hereinafter, example embodiments of the present invention will be described in further detail with reference to the accompanying drawings.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on", "directly connected to", or "directly coupled to" another element or layer, there are no intervening elements or layers present. As used herein, the term "and/or" includes any and all combinations of one or more of the associated listed items. Further, the use of "may" when describing embodiments of the present invention relates to "one or more embodiments of the present invention".

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments only and is not intended to be limiting of example embodiments. As used herein, the singular forms "a", "an", and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The same reference numerals designate the same elements.

Figure 1:
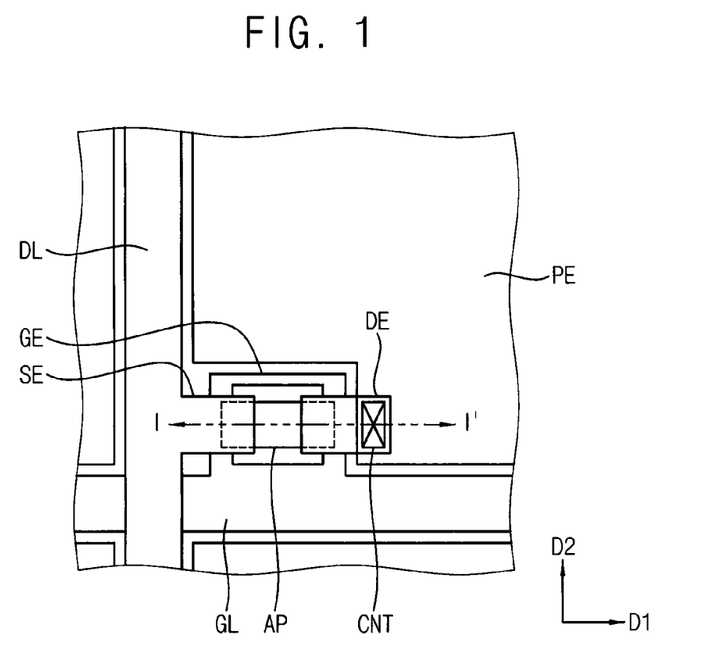
FIG. 1 is a plan view of a thin film transistor substrate according to an example embodiment of the present invention.
Figure 2:
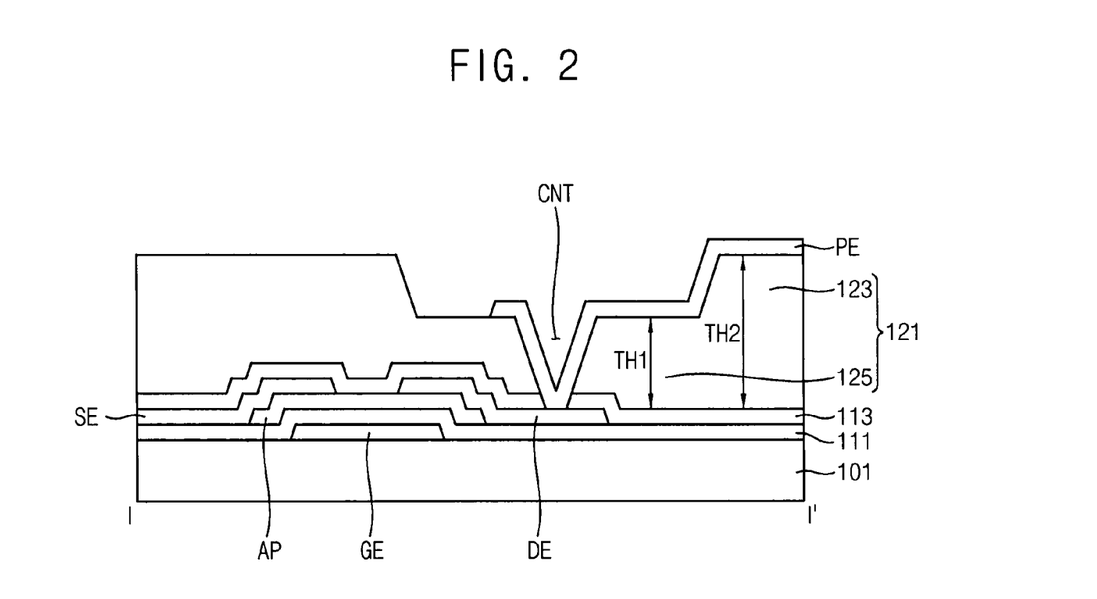
FIG. 2 is a cross-sectional view taken along the line of I-I' in FIG. 1.

FIG. 1 is a plan view of a thin film transistor substrate according to an example embodiment of the present invention. FIG. 2 is a cross-sectional view taken along the line of I-I' in FIG. 1.

Referring to FIG. 1 and FIG. 2, a thin film transistor substrate according to the present example embodiment may include a base substrate 101, a switching element disposed on the base substrate 101, and an organic insulation layer 121. The switching element may include a gate electrode GE, a gate insulation layer 111, an active pattern AP, a source electrode SE, and a drain electrode DE. The thin film transistor substrate may further include a passivation layer 113 and a transparent electrode PE. The thin film transistor substrate may further include a gate line GL and a data line DL. Although the switching element illustrated in FIG. 1 and FIG. 2 has a bottom gate structure in which the active pattern AP is disposed on the gate electrode GE, the switching element of the thin film transistor substrate according to example embodiments of the present invention is not limited thereto. For example, the switching element of the thin film transistor substrate may have, for example, a top gate structure in which the gate electrode GE is disposed on the active pattern AP.

The base substrate 101 may include a transparent insulation material. For example, the base substrate 101 may include, glass, quartz, plastic, such as a polyethylene terephthalate resin, a polyethylene resin, a polycarbonate resin, etc. For example, the base substrate 101 may be a flexible substrate.

The gate line GL may extend in a first direction D1 on the base substrate 101. The gate line GL may include, for example, aluminum (Al), gold (Au), silver (Ag), copper (Cu), iron (Fe), nickel (Ni), etc. These may be used alone or in a mixture thereof. The gate line GL may include, for example, indium doped zinc oxide ("IZO"), gallium doped zinc oxide ("GZO"), etc.

The gate electrode GE may be electrically coupled to (e.g., electrically connected to) the gate line GL. The gate electrode GE may include, for example, a same material as the gate line GL. For example, the gate electrode GE may be integrally formed with the gate line GL.

The gate insulation layer 111 may be disposed on the base substrate 101 on which the gate electrode GE is disposed. The gate insulation layer 111 may include, for example, silicon oxide, silicon nitride, etc.

The active pattern AP may be disposed on the gate insulation layer 111. The active pattern AP may overlap the gate electrode GE. The active pattern AP may include, for example, indium (In), zinc (Zn), gallium (Ga), tin (Sn), hafnium (Hf), etc. For example, the active pattern AP may include an oxide semiconductor material. For example, the active pattern AP may include indium gallium zinc oxide ("IGZO"), indium tin zinc oxide ("ITZO"), hafnium indium zinc oxide ("HIZO"), etc.

The data line DL may be disposed on the base substrate 101 on which the active pattern AP is disposed. The data line DL may extend in a second direction D2 crossing (e.g., perpendicular to) the first direction D1. The data line DL may include, for example, a same material as the gate line GL. For example, the data line DL may include aluminum (Al), gold (Au), silver (Ag), copper (Cu), iron (Fe), nickel (Ni), etc. These may be used alone or in a mixture thereof.

The source electrode SE may be disposed on the gate insulation layer 111. The source electrode SE may overlap a first end portion (e.g., a first end) of the active pattern AP. The source electrode SE may be electrically coupled to the data line DL. For example, the source electrode SE may be integrally formed with the data line DL.

The drain electrode DE may be disposed on the gate insulation layer 111. The drain electrode DE may overlap a second end portion (e.g., a second end) of the active pattern AP. The drain electrode DE may be spaced from (e.g., spaced apart from) the source electrode SE. The drain electrode DE may include, for example, a same material as the source electrode SE. For example, the source electrode SE and the drain electrode DE may include aluminum (Al), gold (Au), silver (Ag), copper (Cu), iron (Fe), nickel (Ni), etc. These may be used alone or in a mixture thereof.

The passivation layer 113 may be disposed on the source electrode SE and the drain electrode DE. The passivation layer 113 may cover the source electrode SE and the drain electrode DE. The passivation layer 113 may include, for example, an inorganic insulation material. For example, the passivation layer 113 may include silicon oxide, silicon nitride, etc.

The organic insulation layer 121 may cover the passivation layer 113. The organic insulation layer 121 may include, for example, an acryl resin, a phenol resin, etc. The organic insulation layer 121 may include a first thickness portion 125 having a first thickness TH1 and a second thickness portion 123 having a second thickness TH2. The second thickness TH2 may be greater than the first thickness TH1. The second thickness portion 123 may be adjacent to the first thickness portion 125. The second thickness portion 123 may be integrally formed with the first thickness portion 125. For example, the second thickness portion 123 may surround (e.g., may surround a periphery of) the first thickness portion 125.

A contact opening CNT (e.g., a contact hole) may be defined in the first thickness portion 125 of the organic insulation layer 121. The contact opening CNT may overlap a first portion of the drain electrode DE. The first thickness TH1 of the first thickness portion 125 of the organic insulation layer 121 may be equal to or less than about 2.0 µm. For example, the first thickness TH1 of the first thickness portion 125 of the organic insulation layer 121 may be about 2.0 µm.

The second thickness portion 123 of the organic insulation layer 121 may be adjacent to the first thickness portion 125. The second thickness TH2 of the second thickness portion 123 of the organic insulation layer 121 may be equal to or greater than about 2.0 µm. For example, the second thickness TH2 of the second thickness portion 123 of the organic insulation layer 121 may be greater than the first thickness TH1 of the first thickness portion 125 of the organic insulation layer 121 by about 0.5 µm or more. For example, the second thickness TH2 of the second thickness portion 123 of the organic insulation layer 121 may be about 4.0 µm. The second thickness portion 123 of the organic insulation layer 121 may have a substantially flat surface. A first height of the first thickness portion 125 may be less than a second height of the second thickness portion 123 with respect to the base substrate 101.

The transparent electrode PE may be disposed on the organic insulation layer 121. The transparent electrode PE may contact the first portion of the drain electrode DE through the contact opening CNT defined in the organic insulation layer 121 and the passivation layer 113. The transparent electrode PE may partially overlap the first thickness portion 125 of the organic insulation layer 121. A width of the first portion of the drain electrode DE at which the transparent electrode PE contacts the drain electrode may be equal to or greater than about 1.0 µm and equal to or less than about 2.0 µm. For example, the width of the first portion of the drain electrode DE contacting the transparent electrode PE may be about 1.5 µm.

The transparent electrode PE may include a transparent conductive material. For example, the transparent material PE may include indium zinc oxide ("IZO"), indium tin oxide ("ITO"), tin oxide (SnOx), zinc oxide (ZnOx), etc.

As mentioned above, the thin film transistor substrate according to an example embodiment of the present invention may include the organic insulation layer 121 having a relatively small thickness TH1 around the contact opening CNT, thereby reducing a height of a photoresist pattern which will be disposed on the first thickness portion 125 of the organic insulation layer 121 and thereby reducing a size of the contact opening CNT formed by removing a portion of the passivation layer 113 using (utilizing) the photoresist pattern.

FIGS. 3A to 3H are cross-sectional views illustrating a method of manufacturing the thin film transistor substrate shown in FIG. 2.

Figure 3A:
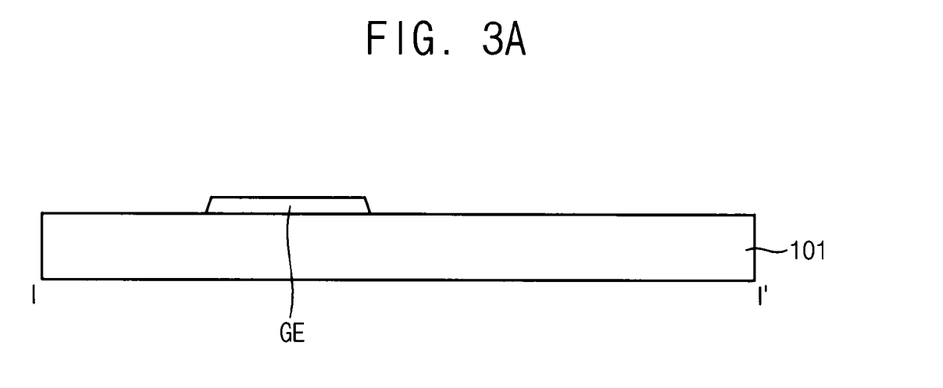
FIGS. 3A to 3H are cross-sectional views illustrating a method of manufacturing the thin film transistor substrate shown in FIG. 2.

Referring to FIG. 3A, in a method of manufacturing a thin film transistor substrate according to the present example embodiment, a gate electrode GE may be formed on a base substrate 101. The base substrate 101 may include a transparent insulation material. The gate electrode GE may include, for example, aluminum (Al), gold (Au), silver (Ag), copper (Cu), iron (Fe), nickel (Ni), etc.

Figure 3B:
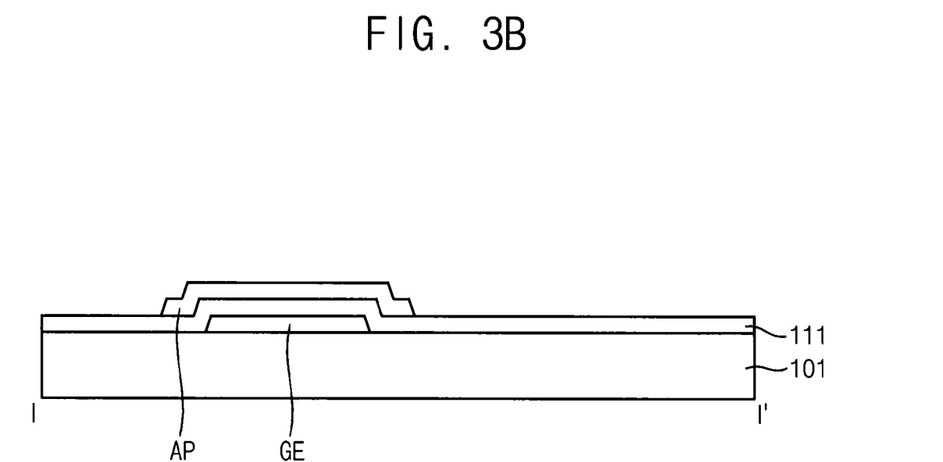

Referring to FIG. 3B, a gate insulation layer 111 may be formed on the base substrate 101 on which the gate electrode GE is formed. The gate insulation layer 111 may include a transparent insulation material such as, for example, silicon oxide, silicon nitride, etc. An active pattern AP may be formed on the gate insulation layer 111. The active pattern AP may overlap the gate electrode GE. The active pattern AP may include, for example, indium (In), zinc (Zn), gallium (Ga), tin (Sn), hafnium (Hf), etc.

Figure 3C:
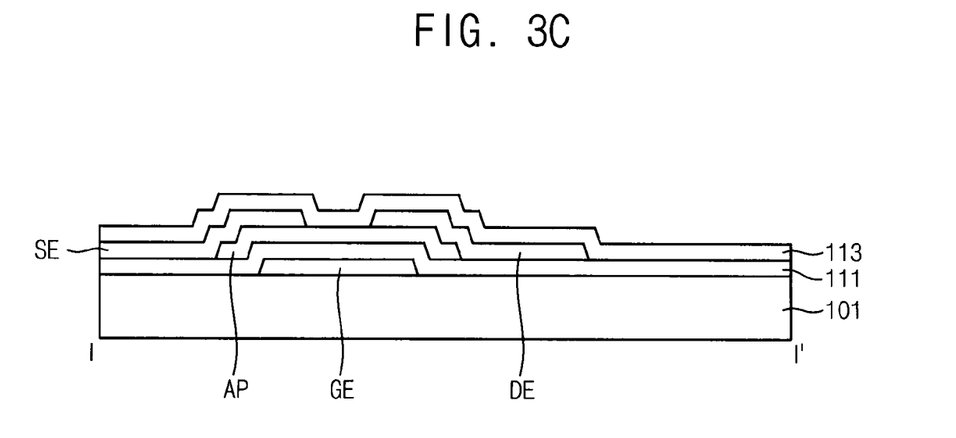

Referring to FIG. 3C, a data metal layer may be formed on the base substrate 101 on which the active pattern AP is formed. The data metal layer may be patterned to form a source electrode SE and a drain electrode DE. The source electrode SE may overlap a first end portion (e.g., a first end) of the active pattern AP. The drain electrode DE may overlap a second end portion of the active pattern AP. The drain electrode DE may be spaced from (e.g., spaced apart from) the source electrode SE. The source electrode SE and the drain electrode DE may partially overlap the gate electrode GE.

A passivation layer 113 may be formed on the base substrate 101 on which the source electrode SE and the drain electrode DE are formed. The passivation layer 113 may cover the source electrode SE and the drain electrode DE. The passivation layer 113 may include an inorganic insulation material.

Figure 3D:
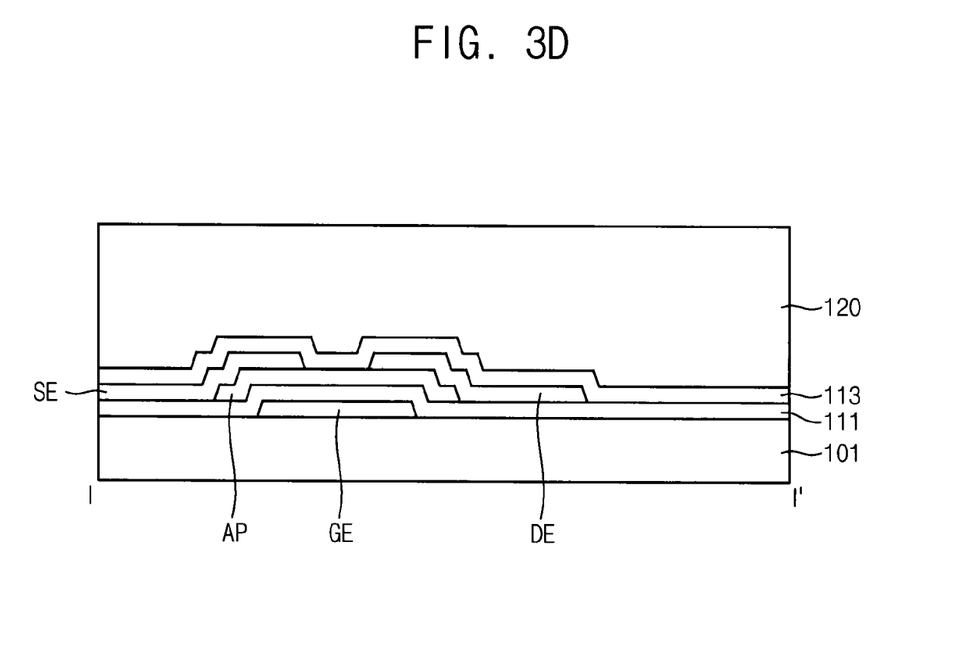

Referring to FIG. 3D, an organic insulation layer 120 may be formed on the base substrate 101 on which the passivation layer 113 is formed. The organic insulation layer 120 may have a substantially flat surface.

Figure 3E:
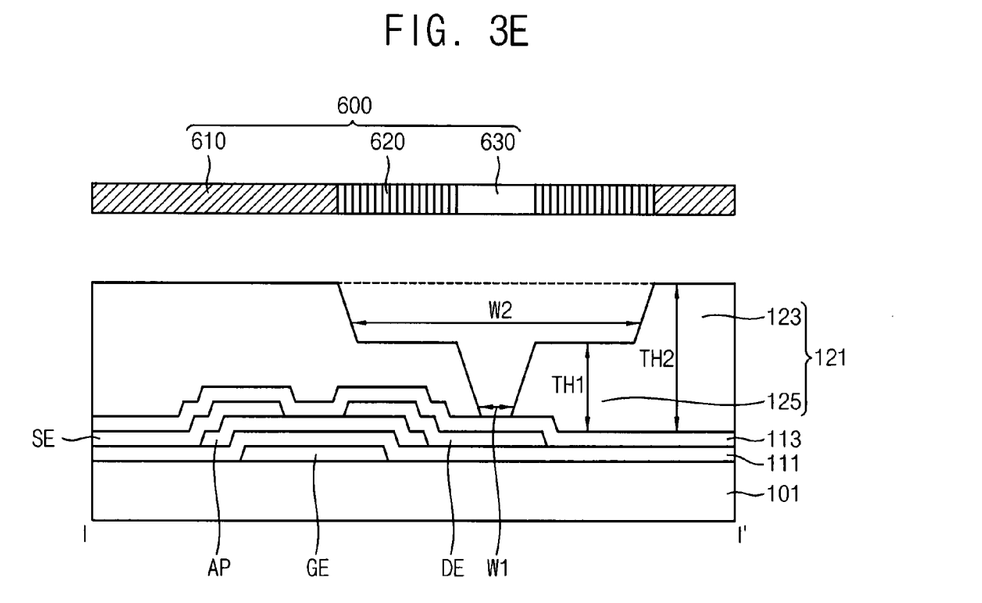

Referring to FIG. 3D and FIG. 3E, a mask 600 may be provided on or over the organic insulation layer 120. The organic insulation layer 120 may be patterned by using (utilizing) the mask 600. The mask 600 may include a light transmitting portion 630, a half-transmitting portion 620, and a light blocking portion 610. In other example embodiments, the mask 600 may include a slit portion instead of the half-transmitting portion 620.

The light transmitting portion 630 may overlap (e.g., may be over) a first portion of the drain electrode DE. The light transmitting portion 630 may be configured to transmit light having a first optical density toward the organic insulation layer 120.

The half-transmitting portion 620 may be adjacent to the light transmitting portion 630. The half-transmitting portion 620 may partially overlap the drain electrode DE. The half-transmitting portion 620 may, for example, surround the light transmitting portion 630. The half-transmitting portion 620 may be configured to transmit light having a second optical density toward the organic insulation layer 120. The second optical density may be lower than the first optical density.

The light blocking portion 610 may be configured to block light illuminated on the organic insulation layer 120. The light blocking portion 610 may be adjacent to the half-transmitting portion 620. For example, the light blocking portion 610 may surround the half-transmitting portion 620 and the light transmitting portion 630.

The organic insulation layer 120 may be illuminated by using (e.g., may be illuminated through) the mask 600 to form a first thickness portion 125 and a second thickness portion 123. The first thickness portion 125 may have a first thickness TH1. The second thickness portion 123 may have a second thickness TH2 greater than the first thickness TH1. For example, the first thickness TH1 may be equal to or less than about 2.0 μm. For example, the first thickness TH1 may be about 2.0 μm. The second thickness portion TH2 may be equal to or greater than about 2.0 μm. For example, the second thickness portion TH2 may be about 4.0 μm. The second thickness TH2 may be greater than the first thickness TH1 by about 0.5 μm or more.

The first thickness portion 125 may overlap (e.g., may correspond to) the half-transmitting portion 620. For example, the first thickness portion 125 may be a portion of the organic insulation layer 120 illuminated through the half-transmitting portion 620.

A portion of the organic insulation layer 120 illuminated through the light transmitting portion 630 may define an opening (e.g., a hole). The opening may be surrounded by the first thickness portion 125. A width W1 of the opening may be less than a width W2 of the first thickness portion TH1. For example, the width W1 of the opening may be equal to or greater than about 1.0 μm and equal to or less than about 2.0 μm.

Figure 3F:
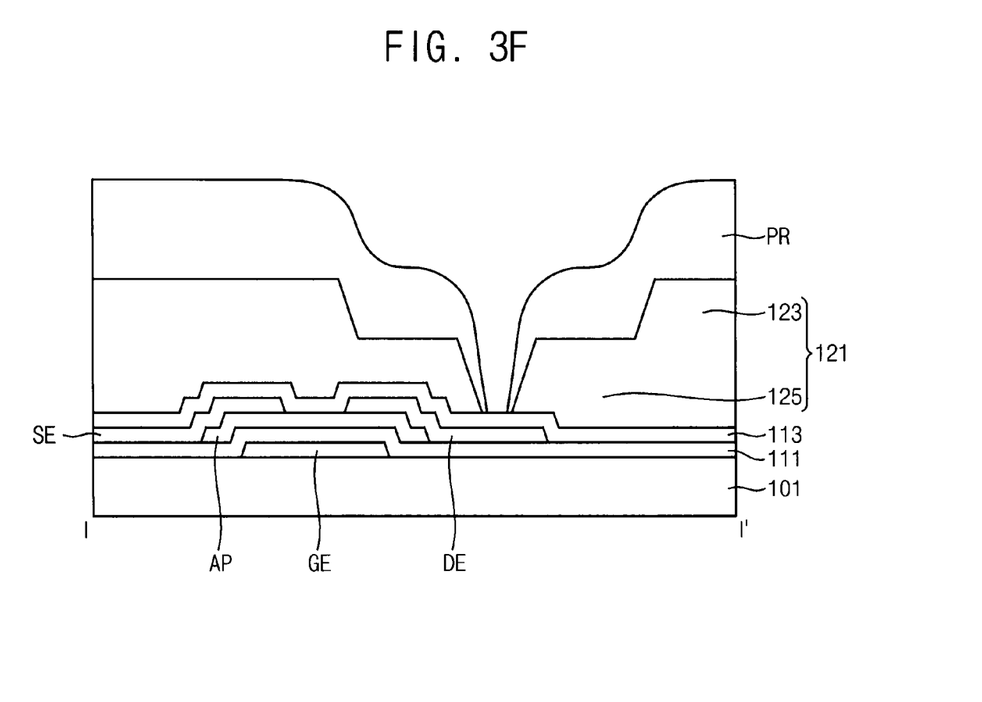

Referring to FIG. 3F, a photoresist pattern PR may be formed on the organic insulation layer 121. The photoresist pattern PR may be formed on the first thickness portion 125 and the second thickness portion 123 of the organic insulation layer 121. The photoresist pattern PR may not be formed in the opening which is surrounded by the first thickness portion 125.

A first height of the photoresist pattern PR on the first thickness portion 125 may be less than a second height of the photoresist pattern PR on the second thickness portion 123 with respect to the base substrate 101. The opening surrounded by the first thickness portion 125 may not be covered by the photoresist pattern PR.

Figure 3G:
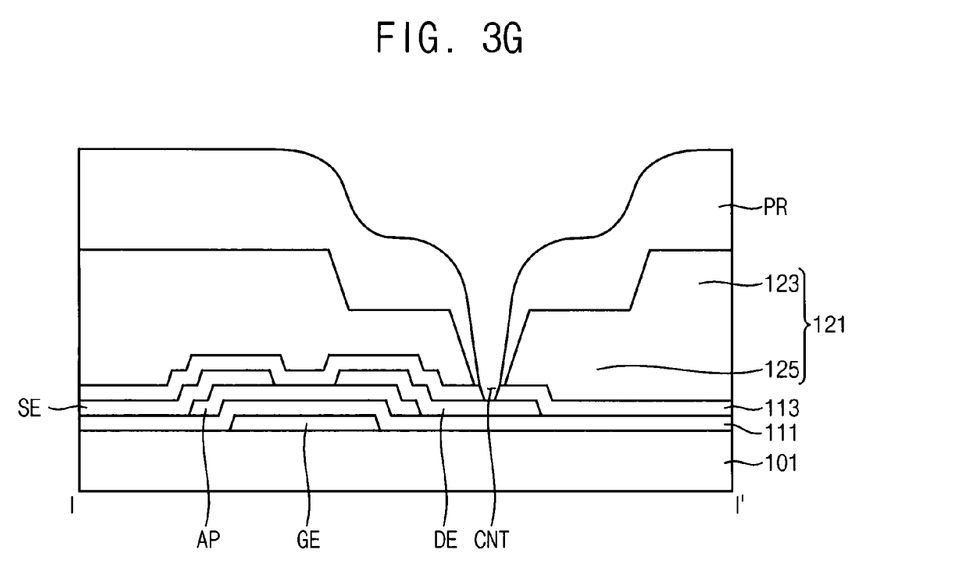

Referring to FIG. 3G, a portion of the passivation layer 113 may be removed by using the photoresist pattern PR as an etch stopper. The removed portion of the passivation layer 113 may be a portion of the passivation layer 113 which is not covered by the photoresist pattern PR. Accordingly, a first portion of the drain electrode DE may be exposed. A contact opening CNT (e.g., a contact hole) may be defined in the passivation layer 113 and the first thickness portion 125 of the organic insulation layer 121.

Figure 3H:
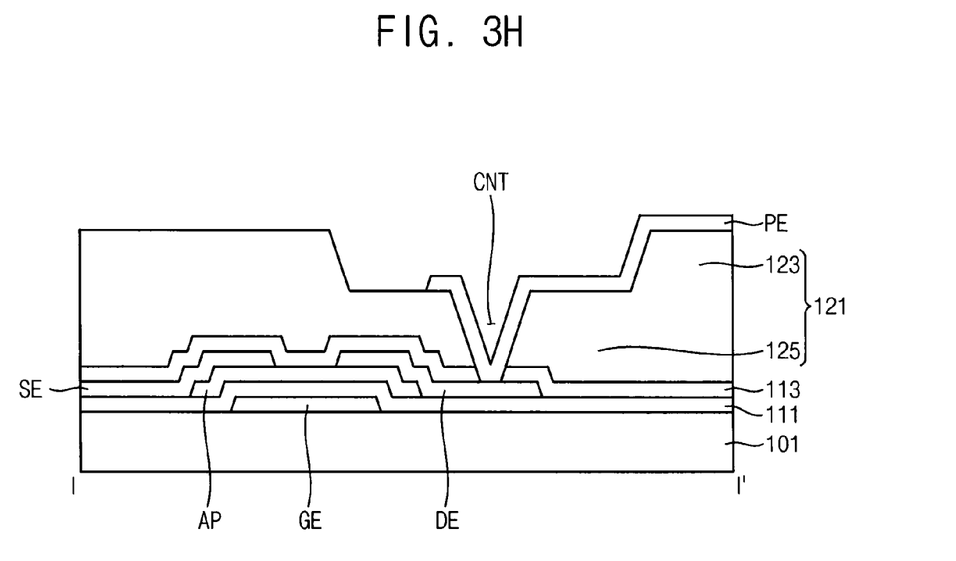

Referring to FIG. 3H, the photoresist pattern PR may be removed. A transparent conductive layer may be formed on the base substrate 101 on which the photoresist pattern PR is removed. The transparent conductive layer may be patterned so that a transparent electrode PE is formed. The transparent electrode PE may overlap the first portion of the drain electrode DE through the contact opening CNT. A width of the contact opening CNT may be equal to or greater than about 1.0 μm and equal to or less than about 2.0 μm. For example, a width of the contact opening CNT may be equal to about 1.5 μm. The transparent electrode PE may partially overlap the first thickness portion 125 of the organic insulation layer 121.

As mentioned above, in a method of manufacturing the thin film transistor substrate according to the present example embodiment of the present invention, the organic insulation layer 121 may have a relatively small thickness TH1 around the contact opening CNT so that a height of the photoresist pattern PR is reduced on the organic insulation layer 121 around the contact opening CNT, thereby forming the contact opening CNT to have a relatively small size by using the photoresist pattern PR.

Figure 4:
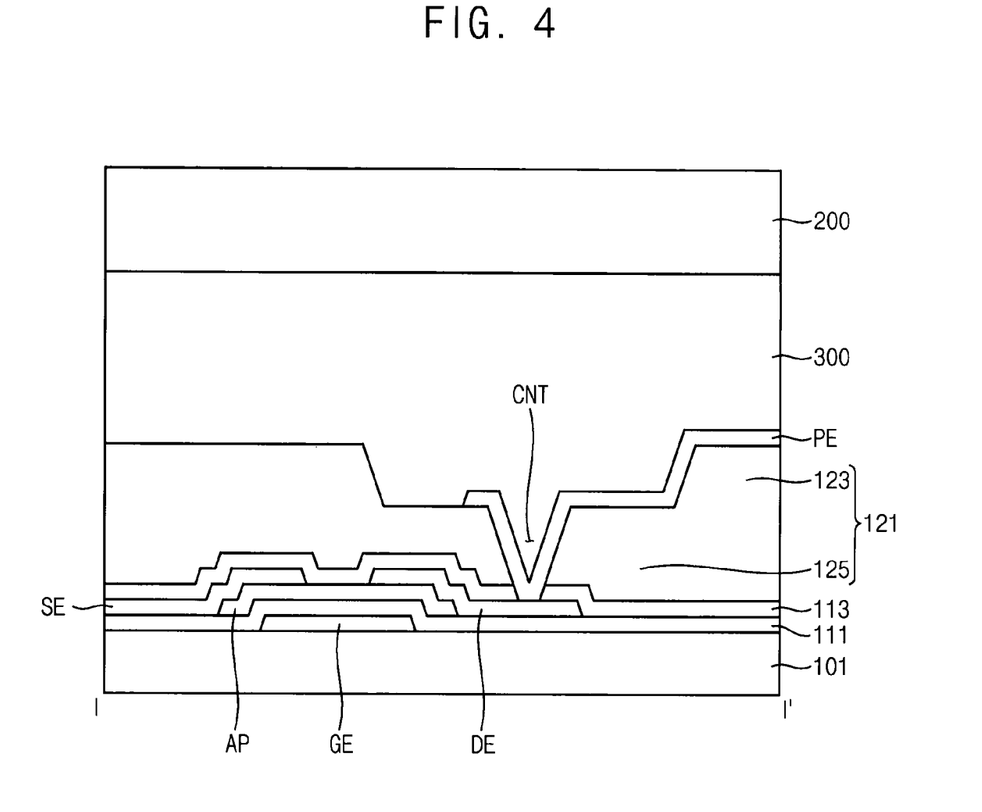
FIG. 4 is a cross-sectional view illustrating a liquid crystal display panel including the thin film transistor substrate shown in FIG. 2.

FIG. 4 is a cross-sectional view illustrating a liquid crystal display panel having the thin film transistor substrate shown in FIG. 2.

Referring to FIG. 4, a liquid crystal display panel according to the present example embodiment may include an array substrate, an opposing substrate 200, and a liquid crystal layer 300. The array substrate may be substantially the same as the thin film transistor substrate illustrated in FIG. 2. Hereinafter, the identical elements are briefly described.

The array substrate may include a base substrate 101, a switching element, and an organic insulation layer 121. The switching element may be disposed on the base substrate 101. The switching element may include a gate electrode GE, a gate insulation layer 111, an active pattern AP, a source electrode SE, and a drain electrode DE. The array substrate may further include a passivation layer 113 and a transparent electrode PE. The array substrate may further include a gate line and a data line.

The base substrate 101 may include a transparent insulation material.

The gate line may extend in a first direction on the base substrate 101.

The gate electrode GE may be electrically coupled to the gate line. For example, the gate electrode GE may be integrally formed with the gate line.

The gate insulation layer 111 may be disposed on the base substrate 101 on which the gate electrode GE is disposed.

The active pattern AP may be disposed on the gate insulation layer 111. The active pattern AP may overlap the gate electrode GE.

The data line may be disposed on the base substrate 101 on which the active pattern AP is disposed. The data line may extend in a second direction crossing (e.g., perpendicular to) the first direction.

The source electrode SE may be disposed on the gate insulation layer 111. The source electrode SE may overlap a first end portion of the active pattern AP. For example, the source electrode SE may be integrally formed with the data line.

The drain electrode DE may be disposed on the gate insulation layer 111. The drain electrode DE may overlap a second end portion of the active pattern AP. The drain electrode DE may be spaced from (e.g., spaced apart from) the source electrode SE.

The passivation layer 113 may cover the source electrode SE and the drain electrode DE.

The organic insulation layer 121 may cover the passivation layer 113. The organic insulation layer 121 may include a first thickness portion 125 and a second thickness portion 123. The first thickness portion 125 may have a first thickness TH1. The second thickness portion 123 may have a second thickness TH2 greater than the first thickness TH1. The second thickness portion 123 may be adjacent to the first thickness portion 125. For example, the second thickness portion 123 may surround the first thickness portion 125.

A contact opening CNT (e.g., a contact hole) may be defined in the first thickness portion 125 of the organic insulation layer 121. The contact opening CNT may overlap a first portion of the drain electrode DE. The first thickness TH1 of the first thickness portion 125 of the organic insulation layer 121 may be greater than zero and equal to or less than about 2.0 μm.

The second thickness portion 123 of the organic insulation layer 121 may be adjacent to the first thickness portion 125 of the organic insulation layer 121. The second thickness TH2 of the second thickness portion 123 of the organic insulation layer 121 may be equal to or greater than about 2.0 μm. For example, the second thickness TH2 of the second thickness portion 123 of the organic insulation layer 121 may be greater than the first thickness TH1 of the first thickness portion 125 of the organic insulation layer 121 by about 0.5 μm or more. A first height of the first thickness portion 125 of the organic insulation layer 121 may be less than a second height of the second thickness portion 123 of the organic insulation layer 121 with respect to the base substrate 101.

The transparent electrode PE may be disposed on the organic insulation layer 121. The transparent electrode PE may contact the first portion of the drain electrode DE through the contact opening CNT defined in the passivation layer 113 and the organic insulation layer 121. The transparent electrode PE may partially overlap the first thickness portion 125 of the organic insulation layer 121. A width of the contact opening CNT may be equal to or greater than about 1.0 μm and equal to or lower than about 2.0 μm. For example, the width of the contact opening CNT may be equal to about 1.5 μm.

The opposing substrate 200 may face the array substrate.

The liquid crystal layer 300 may be disposed between the array substrate and the opposing substrate 200.

As mentioned above, according to one or more example embodiments of the thin film transistor substrate, a liquid crystal display panel having the thin film transistor substrate, and a method of manufacturing the thin film transistor substrate, an organic insulation layer may be relatively thin (e.g., may have a relatively small thickness) around a contact opening so that a height of a photoresist pattern on the organic insulation layer around the contact opening is reduced, thereby the contact opening may be formed to have a relatively small size by using the photoresist pattern.

The foregoing is illustrative of example embodiments and is not to be construed as limiting thereof. Although a few example embodiments have been described, those skilled in the art will readily appreciate that many modifications are possible to these example embodiments without materially departing from the novel teachings and aspects of the present invention. Accordingly, all such modifications are intended to be included within the scope of example embodiments as defined in the claims and their equivalents. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed herein and that modifications to the disclosed example embodiments, as well as other example embodiments, are intended to be included within the scope of the appended claims and their equivalents.

What is claimed is:

1. A thin film transistor substrate comprising:
   a gate electrode on a base substrate;
   an active pattern on the gate electrode;
   a source electrode on a first end of the active pattern;
   a drain electrode on a second end of the active pattern, the drain electrode being spaced from the source electrode;
   an organic insulation layer on the source electrode and the drain electrode; and
   a transparent electrode contacting the drain electrode via a contact opening in the organic insulation layer,
   wherein the organic insulation layer comprises a first thickness portion around the contact opening and a second thickness portion surrounding a periphery of the first thickness portion, the second thickness portion having a thickness greater than that of the first thickness portion, an upper surface of the second thickness portion being above an upper surface of the first thickness portion, and
   wherein the thickness of the second thickness portion is greater than the thickness of the first thickness portion by about 0.5 µm or more.

2. The thin film transistor substrate of claim 1, wherein the first thickness portion is over the drain electrode.

3. The thin film transistor substrate of claim 1, wherein the thickness of the first thickness portion is equal to or less than about 2.0 µm.

4. The thin film transistor substrate of claim 1, wherein the thickness of the second thickness portion is equal to or greater than about 2.0 µm.

5. The thin film transistor substrate of claim 1, wherein a width of the contact opening is equal to or greater than about 1.0 µm and equal to or less than about 2.0 µm.

6. The thin film transistor substrate of claim 1, further comprising an inorganic insulation layer between the drain electrode and the organic insulation layer.

7. The thin film transistor substrate of claim 1, wherein the transparent electrode is over the first thickness portion of the organic insulation layer.

8. The thin film transistor substrate of claim 1, wherein a first height of the first thickness portion of the organic insulation layer is less than a second height of the second thickness portion of the organic insulation layer with respect to the base substrate.

9. The thin film transistor substrate of claim 1, wherein the second thickness portion of the organic insulation layer surrounds a periphery of the first thickness portion of the organic insulation layer.

10. The thin film transistor substrate of claim 1, wherein an end of the transparent electrode is on the first thickness portion of the organic insulation layer.

11. The thin film transistor substrate of claim 1, wherein a first upper surface and a second upper surface of the first thickness portion extend from the contact opening in opposite directions, respectively, and a length of the first upper surface is substantially same as a length of the second upper surface.

12. A liquid crystal display panel comprising:
   an array substrate comprising a thin film transistor;
   an opposing substrate facing the array substrate; and
   a liquid crystal layer between the array substrate and the opposing substrate,
   wherein the array substrate further comprises:
      a gate line on a base substrate, the gate line extending in a first direction and being electrically coupled to the thin film transistor;
      a data line extending in a second direction crossing the first direction, the data line being electrically coupled to the thin film transistor;
      an organic insulation layer on the thin film transistor; and
      a pixel electrode contacting a drain electrode of the thin film transistor at a contact opening in the organic insulation layer,
   wherein the organic insulation layer comprises a first thickness portion around the contact opening and a second thickness portion adjacent to the first thickness portion, the second thickness portion having a thickness greater than that of the first thickness portion, an upper surface of the second thickness portion being above an upper surface of the first thickness portion, and
   wherein the thickness of the second thickness portion is greater than the thickness of the first thickness portion by about 0.5 µm or more.

13. The liquid crystal display panel of claim 12, wherein the first thickness portion is over the drain electrode.

14. The liquid crystal display panel of claim 12, wherein a thickness of the first thickness portion is equal to or less than about 2.0 µm.

15. The liquid crystal display panel of claim 12, wherein a width of the contact opening is equal to or greater than about 1.0 µm and equal to or less than about 2.0 µm.

16. The liquid crystal display panel of claim 12, wherein the second thickness portion of the organic insulation layer surrounds a periphery of the first thickness portion of the organic insulation layer.

17. The liquid crystal display panel of claim 12, wherein an end of the pixel electrode is on the first thickness portion of the organic insulation layer.

18. The liquid crystal display panel of claim 12, wherein a first upper surface and a second upper surface of the first thickness portion extend from the contact opening in opposite directions, respectively, and a length of the first upper surface is substantially same as a length of the second upper surface.

* * * * *